United States Patent [19]

Ohsawa

[11] 4,121,161
[45] Oct. 17, 1978

[54] AM RECEIVER
[75] Inventor: Mitsuo Ohsawa, Fujisawa, Japan
[73] Assignee: Sony Corporation, Tokyo, Japan
[21] Appl. No.: 642,344
[22] Filed: Dec. 19, 1975
[30] Foreign Application Priority Data
Dec. 28, 1974 [JP] Japan .................................. 50-3367
[51] Int. Cl.$^2$ ............................................. H04B 1/28
[52] U.S. Cl. .................................. 325/404; 325/319; 325/392; 325/405
[58] Field of Search ............... 325/319, 400, 404, 405, 325/411, 408, 409, 410, 137, 392; 330/133, 30 D, 134

[56] References Cited
U.S. PATENT DOCUMENTS

| 3,176,238 | 3/1965 | Dickerson, Jr. ...................... 330/134 |
| 3,394,315 | 7/1968 | Gray ..................................... 325/404 |
| 3,550,040 | 12/1970 | Sinusas ................................. 325/137 |
| 3,566,276 | 2/1971 | Finkel ................................... 325/405 |
| 3,665,317 | 5/1972 | Crow ..................................... 325/405 |

OTHER PUBLICATIONS

IRE Trans. On BC & TV Rec. Procedings of the IRE, BTR-1 No. 2, Apr. 1955, pp. 1119-1127, Automatic Gain Control of Transistor Amplifiers., W. F. Crow.

Primary Examiner—Robert L. Griffin
Assistant Examiner—Tommy P. Chin
Attorney, Agent, or Firm—Lewis H. Eslinger; Alvin Sinderbrand

[57] ABSTRACT

An AM receiver comprises an intermediate frequency amplifying stage and a detector stage. The intermediate frequency amplifying stage includes an automatic gain controlled amplifier which functions as a positive feed back amplifier when received signals are under a predetermined level, and functions as a negative feed back amplifier when received signals are over the predetermined level.

7 Claims, 8 Drawing Figures

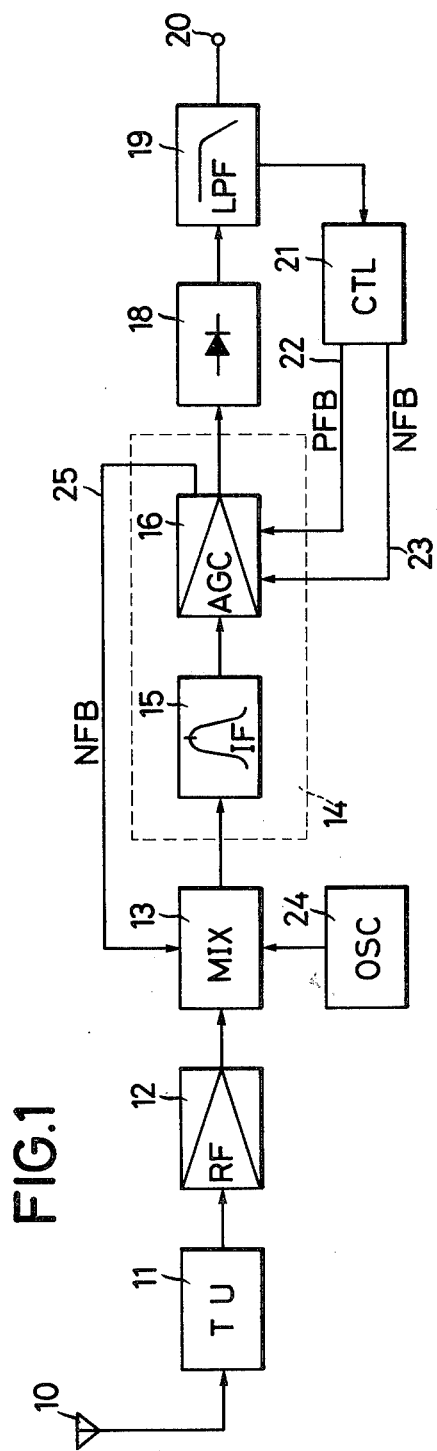
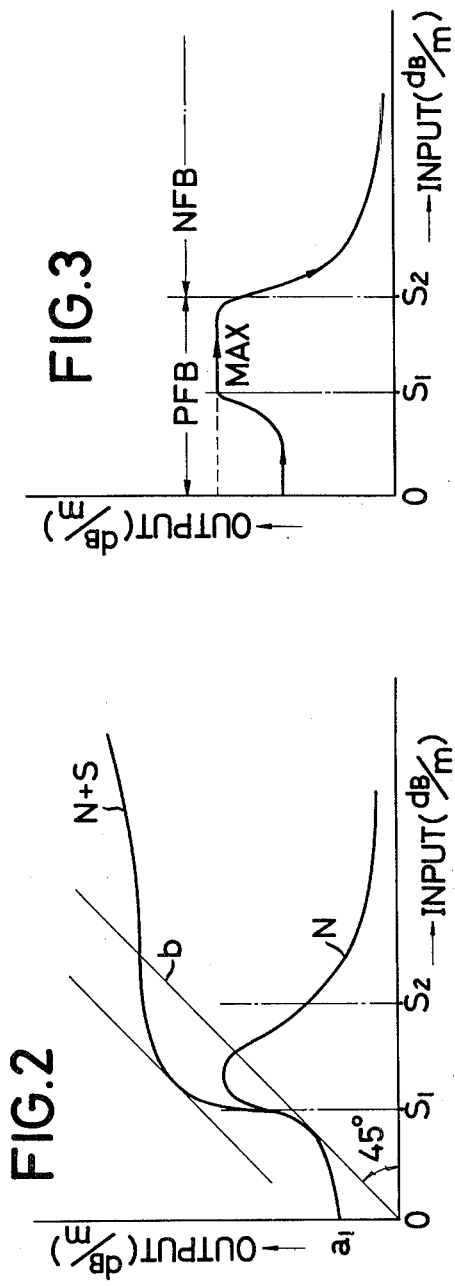

AM RECEIVER

BACKGROUND OF THE INVENTION

1. Field of the Invention

This invention relates generally to an amplitude modulation (AM) receiver, and more particularly to a novel AM receiver provided with an automatic gain control (AGC) amplifier.

2. Description of the Prior Art

A silicon diode or germanium diode is normally used as an AM detector in a transistorized AM receiver. As is well known, germanium diodes have a relatively low threshold voltage of about 0.1V. Accordingly, even when low level signals are received, the rectifying efficiency of the germanium diode is good and there is little distortion. However, low level signals received include a large noise component, which cannot be neglected. As a result, the output signal of the germanium diode includes a large noise component.

Silicon diodes have a relatively high threshold voltage of about 0.6V. Accordingly, when low level signals are received, the rectifying efficiency of silicon diodes is deteriorated. However, the noise component of the detected output signal of silcon diodes is small. The fact that the rectifying efficiency is less when low level signals are received corresponds to the fact that the AM detecting output is distorted.

Generally, the intermediate frequency amplifying stage of the AM receiver includes an automatic gain controlled (AGC) amplifier which is controlled so as to reduce its gain when stronger signals are received. As a result, distortionless reproduced sounds can be reproduced by a loudspeaker. On the other hand, the gain of an AGC amplifier is not controlled when weaker signals are being received. As a result, reproduced sounds with a high noise component, and therefore with a poor signal-to-noise ratio (S/N ratio), or with great distortion factor are reproduced by the loudspeaker.

SUMMARY OF THE INVENTION

In accordance with this invention an AM receiver is provided in which a signal from an AGC amplifier is fed back in the positive sense when signals of lower level are received. The signal is fed back in the negative sense when signals of higher level are received, whereby the reproduced sounds will be relatively free of distortion and yet will have a relatively low noise component.

Also according to this invention an AM receiver is provided in which the gain can be controlled by using a differential amplifier and moreover in which output signals of good quality can be obtained by a simple circuit construction. The difference between the maximum gain and minimum gain can be varied by controlling the value of a load resistor of a gain-controlled differential amplifier, thereby permitting relatively high freedom of design.

The features and advantages of this invention will become more apparent from the following detailed description of illustrative embodiments shown in the accompanying drawings.

BRIEF DESCRIPTION OF THE DRAWINGS

FIG. 1 is a block diagram of an AM receiver according to one embodiment of this invention.

FIG. 2 is a graph showing input-output characteristics of the AM receiver of FIG. 1.

FIG. 3 is a graph showing the input-output characteristic of the AGC amplifier in FIG. 1.

DESCRIPTION OF THE PREFERRED EMBODIMENTS

Figures 4, 5:
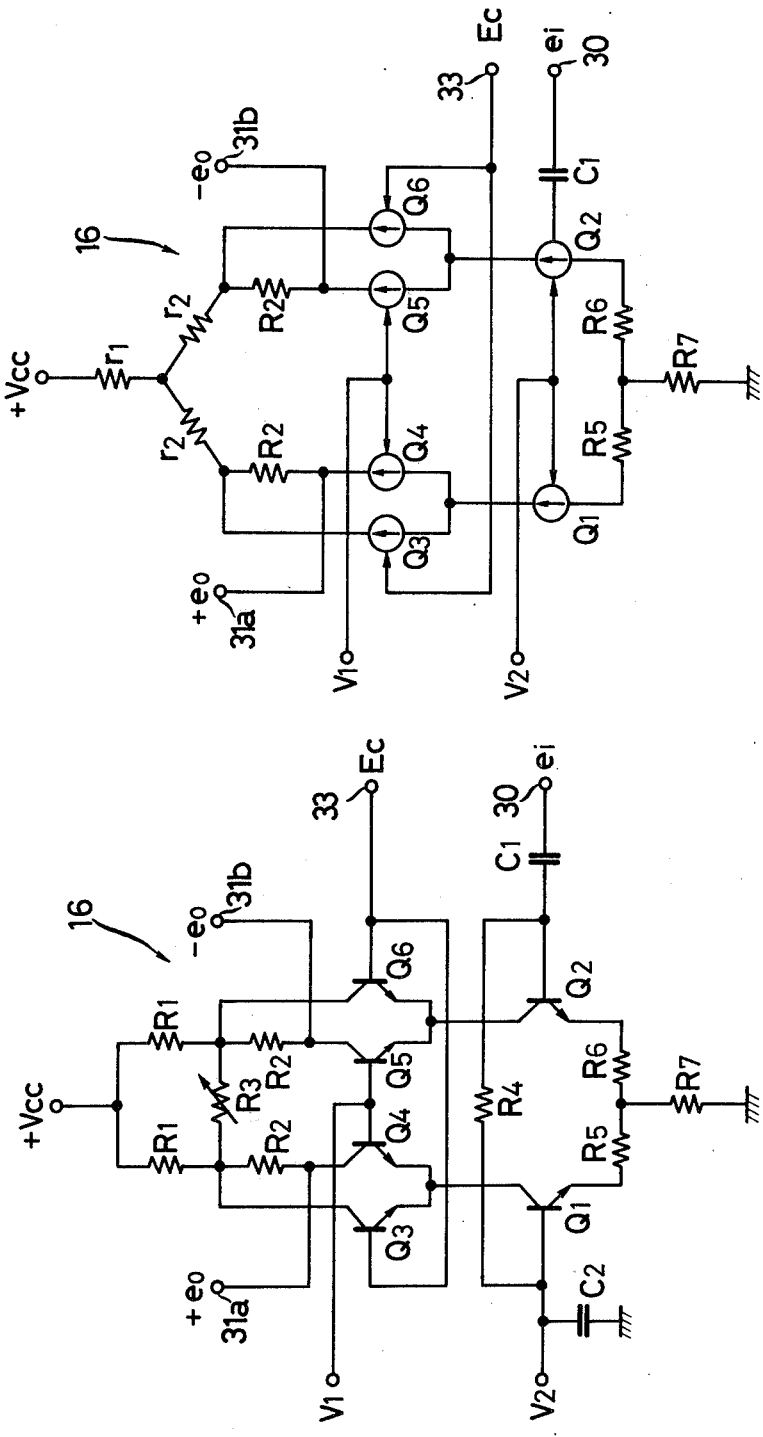
FIG. 4 is a circuit diagram of the AGC amplifier shown in FIG. 1.
FIG. 5 is a diagram of a circuit equivalent to the circuit of FIG. 4.

FIG. 1 shows a block diagram of an AM receiver according to one embodiment of this invention. In FIG. 1, high frequency signals from an antenna 10 are applied to a radio frequency (RF) amplifier 12 through a tuning circuit 11 and amplified by the RF amplifier 12. The output signals of the amplifier 12 are converted into intermediate frequency (IF) signals by a mixer, or a frequency converter 13. The IF signals are supplied to an IF amplifier 14, that includes a narrow band pass filter 15 tuned to an IF band having a central frequency of 455 KHz, and an AGC 16. Besides the filter 15 and the AGC amplifier 16, the amplifier 14 normally includes several amplifiers and filters which are not shown. The output terminal of the IF amplifier 14 is connected to an AM detecting circuit 18 comprising an element of superior linearity, such as a germanium element. The detected output signal of the AM detecting circuit 18 is connected through a low pass filter 19 to an output terminal 20 and is normally connected from the terminal 20 to an audio frequency amplifier and speaker (not shown). An output terminal of the low pass filter 18 is further connected to a control signal generating circuit 21 in which a control signal Ec is generated.

The amplitude of the control signal Ec varies in response to the level of the signal received by the antenna 10. When the level of the signal received at the antenna 10 is extremely low, or nearly zero, the circuit 21 generates a control signal Ec which has a predetermined value. When the level of the signal received at the antenna 10 is low, the generating circuit 21 generates a lower control signal Ec which is at a lower value than the predetermined value. And when the level of the received signal is high, the generating circuit 21 generates a control signal Ec which is at the higher value than the predetermined value.

Figure 8:
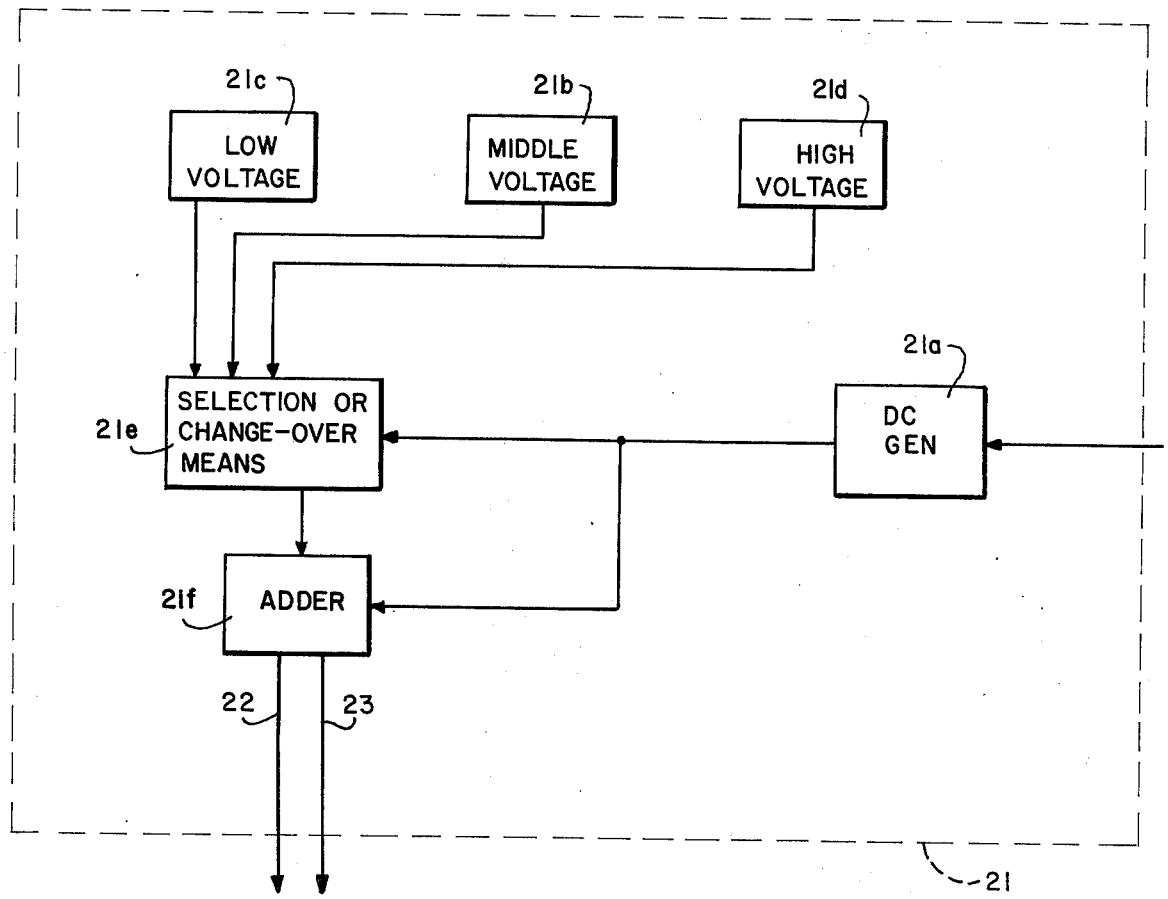
FIG. 8 is a more detailed block diagram of part of FIG. 1.

A positive feed back loop 22 connects the control circuit 21 to the AGC amplifier 16 when the received signal has a low level, and a negative feed back loop 23 connects the control circuit 21 to the AGC amplifier 16, when the received signal has a high level, to control the gain of the amplifier 16. The control signal generating circuit 21, as shown in FIG. 8, comprises, for example; a DC voltage generator 21a to rectify the output signal of the low pass filter 19 to generate a DC voltage corresponding to the level of the received signal; three reference DC power sources 21b, 21c, and 21d having middle voltage, lower voltage and higher voltage; a change-over circuit 21e to change over from one of the three reference DC power sources to the other in response to the level of signals received by the antenna 10; and an adding circuit 21f to add the output of the DC voltage generator to the output of the change-over circuit. When the received signal is at an extremely low level, or even zero level, a middle control signal $Ec$, which is substantially at the same value as the predetermined value, can be obtained by adding the output voltage of the DC voltage generator to the output voltage of the reference DC power source having middle voltage. When the received signal is at a low usable level, a lower control signal $Ec$ can be obtained by adding the output voltage of the DC voltage generator to the output voltage of the reference DC power source having lower voltage. And when the received signal is at a high level, the higher control signal $Ec$ can be obtained by adding the output voltage of the DC voltage generator to the output voltage of the reference DC power source having higher voltage.

Further in FIG. 1, a local oscillator 24 is connected to the mixer 13. A negative feed back loop 25 connects the rectified output signal of the AGC amplifier 16 to control the gain of the converter 13.

FIG. 2 shows the input-output characteristic of the AM receiver of FIG. 1, and FIG. 3 shows the input-output characteristic of the AGC amplifier 16.

In the range of 0 to $S_1$ for extremely low level, or weak, input signals, referring to FIG. 2 and FIG. 3, the AGC amplifier 16 is controlled by the positive feedback loop 22. When the value of the positive feed back signal is suitably predetermined, the noise of the output of the AM receiver is greatly reduced. Moreover, since the detecting circuit 18 has superior linearity, the distortion of the output signal is small. Referring to FIG. 2, the level $a_1$ represents the level of residual noise when the input signal is zero, and a line $b$ inclined at 45° represents the characteristic of the AGC amplifier 16, which is assumed to function as a proportional amplifier.

The value of the positive feed back signal rises with the level of the input signal, and the gain of the AGC amplifier 16 is designed to be substantially constant at its maximum within the range of $S_1$ to $S_2$ for input signals of usable sensitivity. The difference between (N+S) and N where N and S represent the levels of noise and signal, respectively, increases with the level of the input signal within the range of $S_1$ to $S_2$. When the level of the input signal is higher than $S_2$, the positive feed back ceases or is restricted, and then the AGC amplifier 16 is controlled by the negative feed back loop 22.

Next, circuit construction of the AGC amplifier 16 having the characteristic of FIG. 3 will be described with reference to FIG. 4.

The AGC amplifier 16 comprises a first differential amplifier consisting of transistors $Q_1$ and $Q_2$, a second differential amplifier consisting of transistors $Q_3$ and $Q_4$ connected to the collector of the transistor $Q_1$, and a third differential amplifier consisting of transistors $Q_5$ and $Q_6$ connected to the collector of the transistor $Q_2$. An input terminal 30 is connected through a capacitor $C_1$ to the base of the transistor $Q_2$. An intermediate frequency input signal $e_i$ is supplied to the input terminal 30. Output terminals 31a and 31b are connected to the collectors of the transistors $Q_4$ and $Q_5$, respectively. Output voltages $+e_o$ and $-e_o$ are taken from the output terminals 31a and 31b in opposite phase to each other. In practice, one of the output terminals 31a or 31b is connected to the detecting circuit 18. The bases of the transistors $Q_3$ and $Q_6$ are connected in common to a control terminal 33 to which AGC voltages, such as control signals $Ec$ derived from the positive feed back loop 22 or the negative feed back loop 23, are supplied. The collectors of the transistors $Q_4$ and $Q_5$ are connected through a pair of series resistors $R_1$ and $R_2$ to a power source $+Vcc$ of, for example, 12V. The collectors of the transistors $Q_3$ and $Q_6$ are connected through the resistors $R_1$ to the power source $+Vcc$. A variable resistor $R_3$ is connected between the connection points of each pair of the resistors $R_1$ and $R_2$. A predetermined bias voltage $V_1$ is applied to the bases of the transistors $Q_4$ and $Q_5$. The bias voltage $V_1$ is substantially equal to an output voltage of the control signal generating circuit 21 when the level of input signal is within the range of 0 to $S_1$ of FIG. 2 or FIG. 3. Another predetermined bias voltage $V_2 (<V_1)$ is applied to the base of the transistor $Q_1$, and, by way of resistor $R_4$, to the base of the transistor $Q_2$. The emitters of the transistors $Q_1$ and $Q_2$ are connected to resistors $R_5$ and $R_6$, respectively. The latter resistors are connected in series, and the common connection point between them is connected through a resistor $R_7$ to ground.

FIG. 5 shows a circuit equivalent to the circuit of FIG. 4. The $\Delta$-connection of the resistors $R_1$ and $R_3$ in FIG. 4 in converted to a Y-connection of resistors $r_1$ and $r_2$ in FIG. 5.

Next, operation of the circuits will be described.

When the input signal received by the antenna 10 is at an extremely low level, the control signal $Ec$ derived from the circuit 21 in FIG. 1 and applied to the input terminal 33 in FIG. 4 (or FIG. 5) is nearly equal to the bias voltage $V_1$. As a result, the transistors $Q_3$, $Q_4$, $Q_5$ and $Q_6$ are conductive. The signal $e_i$ from the filter 15 in FIG. 1 is supplied to the terminal 30. The output signals $+e_o$ and $-e_o$ in opposite phase to each other are obtained from the output terminals 31a and 31b. The gain of the AGC amplifier 16 in that condition is designed to be lower by about 10 to 15 dB than its maximum gain.

When the level of the received signal approaches $S_1$ in FIG. 2 or FIG. 3, the voltage of the control signal $Ec$ from the circuit 21 becomes lower than the bias voltage $V_1$. Accordingly, currents flowing through the transistors $Q_3$ and $Q_6$ gradually decrease, while currents flowing through the transistors $Q_4$ and $Q_5$ gradually increase. As a result, the gain of the amplifier 16 increases. And when the received signal reaches the lowest level of input signal of usable sensitivity, the voltage of the control signal $Ec$ becomes much lower than the bias voltage $V_1$.

When an input signal $e_i$ is applied to the input terminal 30 in the above-described condition, the transistors $Q_3$ and $Q_6$ are made non-conductive while the transistors $Q_4$ and $Q_5$ are made conductive. The voltage of the output $\pm e_o$ is determined by the resistors $R_1$, $R_2$, and $R_3$ in FIG. 4 or by the related resistors $r_1$, $r_2$, and $R_2$ in FIG. 5. The AGC amplifier 16 operates at maximum gain. At that time, the gain of the AGC amplifier 16 is controlled by the control signal $Ec$ which is applied to the control terminal 33 through the loop 22 from the control signal generating circuit 21. Thus, the AGC amplifier 16 functions as a positive feed back amplifier when the input signals are in the range from $S_1$ to $S_2$ shown in FIG. 2 and FIG. 3.

When signals received by the antenna 10 is at a sufficiently high level, the value of the control signal $Ec$ from the circuit 21 becomes higher than that of the bias voltage $V_1$. With the application of such control signal $Ec$, the transistors $Q_3$ and $Q_6$ are made conductive while the transistors $Q_4$ and $Q_5$ are made non-conductive. The bases of the transistors $Q_1$ and $Q_2$ are at the same potential. Currents from the power source $+Vcc$ flow through two routes: namely, through one of the resistors $R_1$, and the transistors $Q_3$ and $Q_1$, and through the other resistor $R_1$ and the transistors $Q_6$ and $Q_2$ in FIG. 4.

The input signal $e_i$ from the input terminal 30 is applied to the base of the transistor $Q_2$ through the capacitor $C_1$. Accordingly, signal output currents in opposite phase to each other flow through the above-described two routes. Thus, output signals $+e_o$ and $-e_o$ in opposite phase to each other are obtained from the output terminals 31a and 31b, respectively. The gain for the output signals can be determined by the resistors $R_1$ and $R_3$. In that condition, the AGC amplifier 16 operates at the minimum gain, when the received signals are at the level over $S_2$ shown in FIG. 2 and FIG. 3. At that time, the gain of the AGC amplifier 16 is controlled by the control signal Ec which is applied to the control terminal 33 through the loop 23 from the control signal generating circuit 21. Thus, the AGC amplifier 16 functions as a negative feed back amplifier at antenna input signal levels higher than $S_2$.

Figure 6:
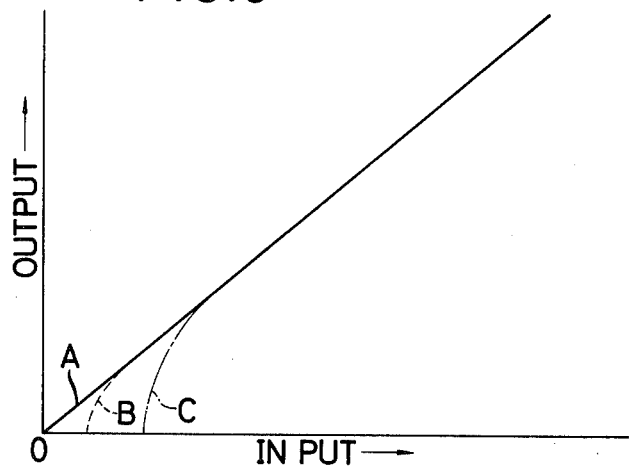
FIG. 6 is a graph showing the input-output characteristic of the detecting circuit in FIG. 1.

By the above-described arrangements, distortionless detecting outputs having little noise can be obtained, even when the level of received signals is very low. FIG. 6 shows input-output characteristics of detecting circuits. Curve A shows the characteristic of the detecting circuit 18 according to this invention which is superior in linearity, since the AGC amplifier 16 is positively fed back when the level of the received signal is lower. Curves B and C show the characteristics of conventional detecting circuits comprising only a germanium diode and a silicon diode, respectively, which are inferior in linearity.

A gain difference $\Delta G$ of the equivalent circuit of FIG. 5 operating as above described, is represented by:

$$\Delta G = 20\log (r_2 + R_2/r_3) \, (dB)$$

Figure 7:
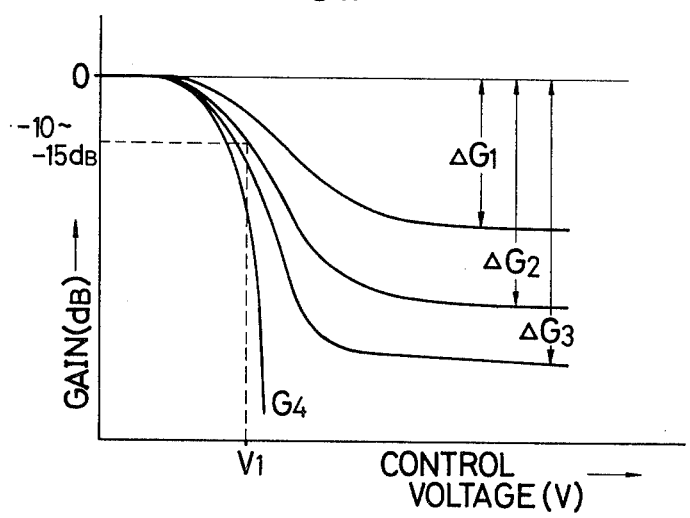
FIG. 7 is a graph showing the relationships between the control voltage and the gain of the AGC amplifier in FIG. 1.

The $\Delta G$ can be varied by controlling the equivalent load resistor, namely by adjusting the resistor $R_3$. FIG. 7 shows the relationships between the control voltage Ec and the gain in the AGC amplifier 16. Various gain differences $\Delta G_1$, $\Delta G_2$, and $\Delta G_3$ decided by different values of the resistor $R_3$ are shown in FIG. 7. Curve $G_4$ is for $r_2 = 0$, i.e., $R_1$ or $R_3 = 0$.

In the AM receiver according to this invention, since the level of the positive feed back signal is raised with the rise of the level of the input signal, in the range of 0 to $S_1$ of the lower input signals, and the AGC amplifier operates at the maximum gain in the range of $S_1$ to $S_2$ of the usable-sensitivity input signals, noise can be reduced without increasing distortion even when the level of the input signals is lower. Accordingly, output signals with less noise and distortion can always be obtained regardless of the level of the input signal.

Even when the input signal is detuned, noise can be less.

Although the positive feedback loop 22 and the negative feed back loop 23 are separately shown in FIG. 1, the output from the circuit 21 may be supplied to the AGC amplifier 16 through one feed back loop. The point is that the AGC amplifier 16 functions as the positive feed back amplifier or the negative feed back amplifier in response to the level of the input signal.

While there have been described preferred embodiments of the invention, it is obvious that modifications and variations are possible in light of the above teachings. It is therefore to be understood that within the scope of the appended claims, the invention may be practised otherwise than as specifically described.

What is claimed is:

1. In an AM receiver having an amplifier stage for amplifying received signals which vary from an extremely low level through a range of usable sensitivity to a high level, said amplifier stage including an automatic gain control means for providing gain variable between a maximum gain level and a minimum gain level, detector and filtering means coupled to said amplifier stage for providing an audio signal, and control means having an input coupled to said detector and filtering means and providing a control signal to said automatic gain control means for changing said gain thereof to a predetermined gain level intermediate said maximum and minimum gain levels when said received signals are at said extremely low level, to said maximum gain level when said received signals are within said range of usable sensitivity, and to said minimum gain level when said received signals are at said high level; said automatic gain control means comprising:
   first and second bias voltage sources;
   first and second input terminals receiving said control signal and said received signal, respectively;
   control current means electrically connected to said first input terminal and responsive to said control signal for producing a control current varying with said control signal;
   signal current means electrically connected to said control current means and to said first bias voltage source for producing a signal current which varies inversely with said control current;
   means electrically connected to said control current means, said signal current means, said second bias voltage source and said second input terminal, and modulating said signal current with said received signal to produce an output signal; and
   output terminal means electrically connected to said signal current means and receiving said output signal through the latter.

2. An AM receiver according to claim 1; wherein said control signal varies from a predetermined control signal level when said received signals are at said extremely low level, through a minimum control signal level lower than said predetermined control signal level when said received signals are within said range of usable sensitivity, to a maximum control signal level greater than said predetermined control signal level when said received signals are at said high level.

3. An AM receiver according to claim 2; wherein said automatic gain control means is responsive to said control signal so as to provide said predetermined gain level when said control signal is at said predetermined control signal level, said maximum gain level when said control signal is at said minimum control signal level, and said minimum gain level when said control signal is at said maximum control signal level.

4. An AM receiver according to claim 1; wherein said control means includes:
   DC voltage generator means electrically connected to said detector and filtering means for rectifying said audio signal and providing a DC voltage corresponding to the level of said received signal;
   low, middle and high reference voltage means;
   reference voltage change-over means for selecting either said low, middle or high voltage means in response to either a middle, low or high DC voltage from said DC voltage generator means; and adding means for adding said DC voltage from said DC voltage generator means to said selected reference voltage for providing said control signal.

5. An AM receiver according to claim 1; wherein said automatic gain control means further includes gain adjusting means electrically connected to said control current means and to said signal current means for controlling said maximum gain level and said minimum gain level.

6. An AM receiver according to claim 5; wherein said control current means includes first and second control current circuits; said signal current means includes first and second signal current circuits electrically connected to said first and second control current circuits, respectively; said output terminal means includes first and second output terminals electrically connected to said first and second signal current circuits, respectively; and wherein said gain adjusting means is electrically connected to said first and second control current, respectively, and to said first and second signal current circuits, respectively.

7. An AM receiver according to claim 6; wherein said gain adjusting means includes a delta connection of resistance means.

* * * * *